US011456263B2

(12) United States Patent
Wei et al.

(10) Patent No.: US 11,456,263 B2
(45) Date of Patent: *Sep. 27, 2022

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Chia-Yu Wei, Tainan (TW); Cheng-Yuan Li, Kaohsiung (TW); Yen-Liang Lin, Tainan (TW); Kuo-Cheng Lee, Tainan (TW); Hsun-Ying Huang, Tainan (TW); Hsin-Chi Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 67 days.

This patent is subject to a terminal disclaimer.

(21) Appl. No.: 16/907,838

(22) Filed: Jun. 22, 2020

(65) Prior Publication Data
US 2020/0321294 A1 Oct. 8, 2020

Related U.S. Application Data

(63) Continuation of application No. 15/906,214, filed on Feb. 27, 2018, now Pat. No. 10,692,826.
(Continued)

(51) Int. Cl.
*H01L 23/00* (2006.01)
*H01L 27/146* (2006.01)

(52) U.S. Cl.
CPC .............. *H01L 24/03* (2013.01); *H01L 24/05* (2013.01); *H01L 24/06* (2013.01); *H01L 24/08* (2013.01);
(Continued)

(58) Field of Classification Search
None
See application file for complete search history.

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

KR 10-2014-0016795 A 2/2014
TW 201417227 A 5/2014
(Continued)

*Primary Examiner* — Long Pham
(74) *Attorney, Agent, or Firm* — Birch, Stewart, Kolasch & Birch, LLP

(57) ABSTRACT

A semiconductor structure is provided. The semiconductor structure includes a first semiconductor device. The first semiconductor device includes a first bonding layer formed below a first substrate, a first bonding via formed through the first oxide layer and the first bonding layer, a first dummy pad formed in the first bonding layer. The semiconductor structure includes a second semiconductor device. The second semiconductor device includes a second bonding layer formed over a second substrate, a second bonding via formed through the second bonding layer, and a second dummy pad formed in the second bonding layer. The semiconductor structure includes a bonding structure between the first substrate and the second substrate, wherein the bonding structure includes the first bonding via bonded to the second bonding via and the first dummy pad bonded to the second dummy pad.

20 Claims, 14 Drawing Sheets

Related U.S. Application Data

(60) Provisional application No. 62/563,871, filed on Sep. 27, 2017.

(52) U.S. Cl.
CPC .............. *H01L 24/32* (2013.01); *H01L 24/80* (2013.01); *H01L 24/83* (2013.01); *H01L 24/92* (2013.01); *H01L 27/1469* (2013.01); *H01L 27/14607* (2013.01); *H01L 27/14634* (2013.01); *H01L 27/14636* (2013.01); *H01L 27/14685* (2013.01); *H01L 2224/03019* (2013.01); *H01L 2224/0346* (2013.01); *H01L 2224/03845* (2013.01); *H01L 2224/05567* (2013.01); *H01L 2224/05571* (2013.01); *H01L 2224/0603* (2013.01); *H01L 2224/06135* (2013.01); *H01L 2224/06136* (2013.01); *H01L 2224/06177* (2013.01); *H01L 2224/06517* (2013.01); *H01L 2224/08146* (2013.01); *H01L 2224/09517* (2013.01); *H01L 2224/32145* (2013.01); *H01L 2224/80075* (2013.01); *H01L 2224/80895* (2013.01); *H01L 2224/80896* (2013.01); *H01L 2224/80948* (2013.01); *H01L 2224/83075* (2013.01); *H01L 2224/83948* (2013.01); *H01L 2224/9211* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2014/0035083 A1 | 2/2014 | Wan et al. |
| 2016/0141282 A1* | 5/2016 | Jang .................. H01L 21/76829 438/455 |

FOREIGN PATENT DOCUMENTS

| | | |
|---|---|---|
| TW | 201729371 A | 8/2017 |
| TW | 201733069 A | 9/2017 |

\* cited by examiner

SEMICONDUCTOR STRUCTURE AND METHOD FOR FORMING THE SAME

CROSS REFERENCE TO RELATED APPLICATIONS

This application is a Continuation application of U.S. patent application Ser. No. 15/906,214, filed on Feb. 27, 2018, which claims the benefit of U.S. Provisional Application No. 62/563,871 filed on Sep. 27, 2017, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
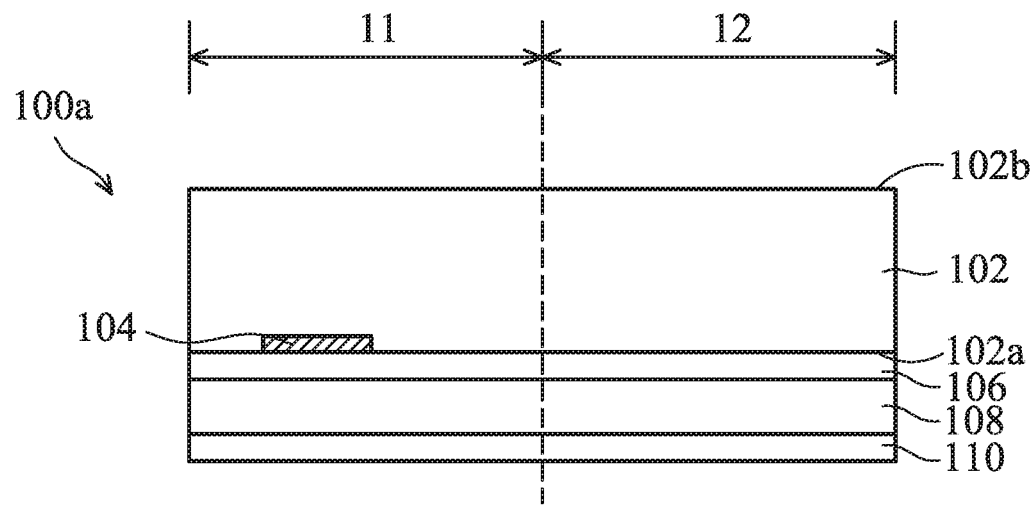
FIGS. 1A-1I show cross-sectional representations of forming a semiconductor structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a semiconductor structure with a hybrid bonding structure are provided. FIGS. 1A-1I show cross-sectional representations of forming a semiconductor structure 300a, in accordance with some embodiments of the disclosure. The semiconductor structure 300a is formed by bonding the first semiconductor device 100a and the second semiconductor device 200a through a hybrid bonding process.

As shown in FIG. 1A, the semiconductor device 100a includes a first substrate 102. The first substrate 102 includes a first surface 102a and a second surface 102b opposite to the first surface 102a. The first substrate 102 may be made of silicon or other semiconductor materials. Alternatively or additionally, the first substrate 102 may include other elementary semiconductor materials such as germanium. In some embodiments, the first substrate 102 is made of a compound semiconductor such as silicon carbide, gallium arsenic, indium arsenide, or indium phosphide. In some embodiments, the first substrate 102 is made of an alloy semiconductor such as silicon germanium, silicon germanium carbide, gallium arsenic phosphide, or gallium indium phosphide. In some embodiments, the first substrate 102 includes an epitaxial layer. For example, the first substrate 102 has an epitaxial layer overlying a bulk semiconductor.

The first substrate 102 includes a first region 11 and a second region 12. In some embodiments, the first substrate 102 is a substrate of an image sensor device. The first region 11 is a first interconnect region (or redistribution layer (RDL) region) and the second region 12 is a pixel region.

In some embodiments, a well portion (not shown) may be formed in the first substrate 102 in the second region 12. An ion implantation process is performed on the first substrate 102 form the well portion. In some embodiments, the well portion may be doped with arsenic (As) or phosphorous (P) ions to form the N-well portion. In some embodiments, the well portion is doped with boron (B) ions to form the P-well portion.

The first substrate 102 may further include isolation features, such as shallow trench isolation (STI) features or local oxidation of silicon (LOCOS) features. Isolation features may define and isolate various device elements.

A first conductive layer 104 is formed in the first region 11 of the first substrate 102. The first conductive layer 104 may be the conductive layer of an interconnect structure. The first conductive layer 104 may be made of copper (Cu), copper alloy, aluminum (Al), aluminum alloy, tungsten (W), tungsten alloy, titanium (Ti), titanium alloy, tantalum (Ta) or tantalum alloy. In some embodiments, the first conductive layer 104 is formed by a plating method.

A first etching stop layer 106 is formed over the first surface 102a of the first substrate 102, and a first oxide layer 108 is formed over the first etching stop layer 106. The first etching stop layer 106 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. The first oxide layer 108 is made of silicon oxide (SiOx).

A first bonding layer 110 is formed over the first oxide layer 108. The first bonding layer 110 has a first etching resistance, and the first oxide layer 108 has a second etching resistance. The second etching resistance is greater than the first etching resistance. In some embodiments, the first bonding layer 110 is made of SiOxFyCzNg, dielectric material, or another applicable material. For example, the first bonding layer 110 is made of silicon oxynitride (SiON) or silicon nitride (SiN). In some embodiments, the first oxide layer 108 is made of silicon oxide ($SiO_2$). It should be noted that since the first bonding layer 110 and the first oxide layer 108 have different etching resistance, the first bonding layer 110 is not made of oxide material. In some embodiments, the first bonding layer 110 is not made of silicon oxide ($SiO_2$).

Figure 1B:
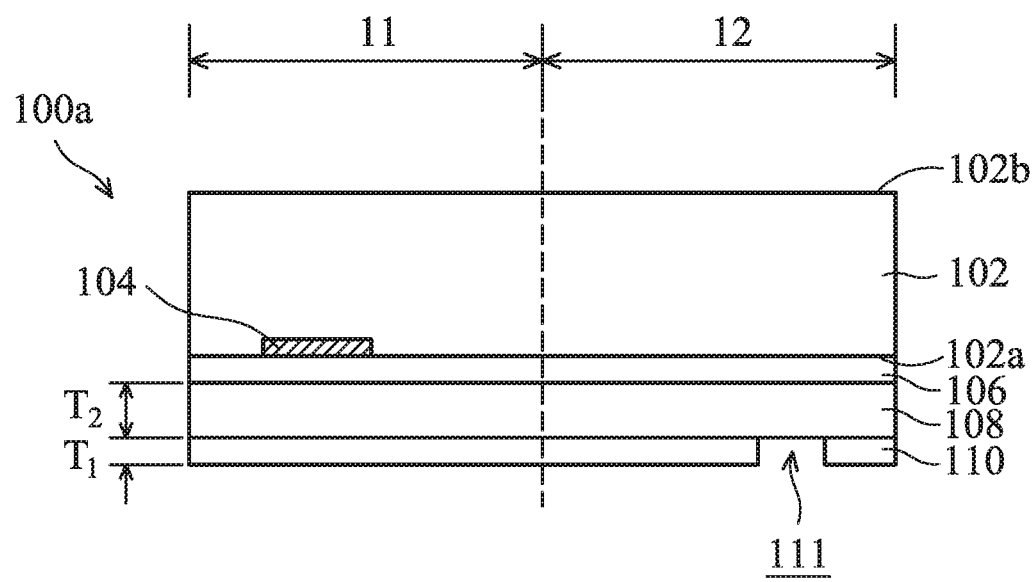

Afterwards, as shown in FIG. 1B, a portion of the first bonding layer 110 in the second region 12 is removed to form a recess 111, in accordance with some embodiments of the disclosure.

The recess 111 is formed by using a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process. Since there is an etching selectivity between the first bonding layer 110 and the first oxide layer 108, the etching process stops until the top surface of the first oxide layer 108 is exposed.

In some embodiments, the first bonding layer 110 is made of silicon oxynitride (SiON), and the first oxide layer 108 is made of silicon oxide ($SiO_2$). It should be noted that the material of the first bonding layer 110 have additional elements, such as nitrogen (N), compared with the material of the first oxide layer 108. The etching process can identify the difference between the SiON and $SiO_2$, and therefore the first bonding layer 110 and the first oxide layer 108 have different etching resistances. The etching process can stop when the top surface of the first oxide layer 108 is exposed.

The first bonding layer 110 has a first thickness $T_1$ along a vertical direction, and the first oxide layer 108 has a second thickness $T_2$ along a vertical direction. If the etching selectivity between the first bonding layer 110 and the first oxide layer 108 is not large enough, the etching depth of the first bonding layer 110 is hard to control. A higher/thicker first bonding layer would be required to prevent the first oxide layer 108 from being removed. Since there is a large etching selectivity between the first bonding layer 110 and the first oxide layer 108 of this embodiment, the CMP process can stop until the top surface of the first oxide layer 108 is exposed. Therefore, the first thickness $T_1$ of the first bonding layer 110 may be designed to be smaller than the second thickness $T_2$ of the first oxide layer 108. In some embodiments, the first thickness $T_1$ of the first bonding layer 110 is in a range from about 0.1 μm to 7 μm. In some embodiments, a ratio ($T_2/T_1$) of the second thickness $T_2$ of the first oxide layer 108 to the first thickness $T_1$ of the first bonding layer 110 is in a range from about 2 to about 10. The overall thickness of the first semiconductor device 100a is reduced since the first thickness $T_1$ of the first bonding layer 110 is reduced. In addition, the fabrication time and cost are reduced due to the thinner first bonding layer 110.

Figure 1C:
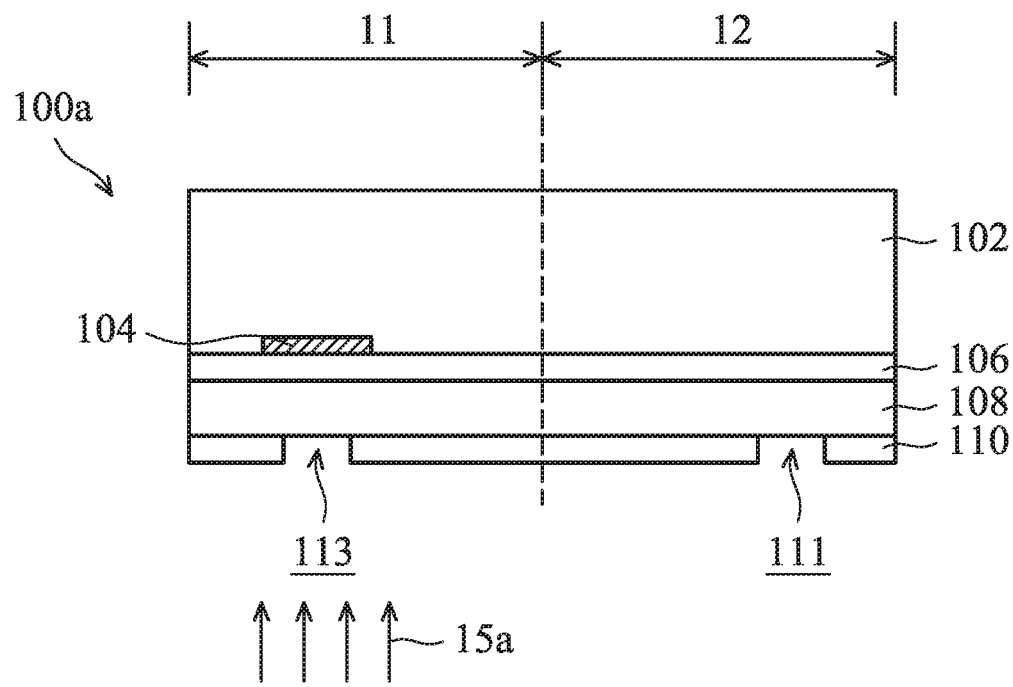

Next, as shown in FIG. 1C, a portion of the first bonding layer 110 in the first region 11 is removed to form a first trench 113, in accordance with some embodiments of the disclosure. The portion of the first bonding layer 110 is removed by performing a first etching step 15a. The top surface of the first oxide layer 108 in the first region 11 is exposed by the first trench 113.

Figure 1D:
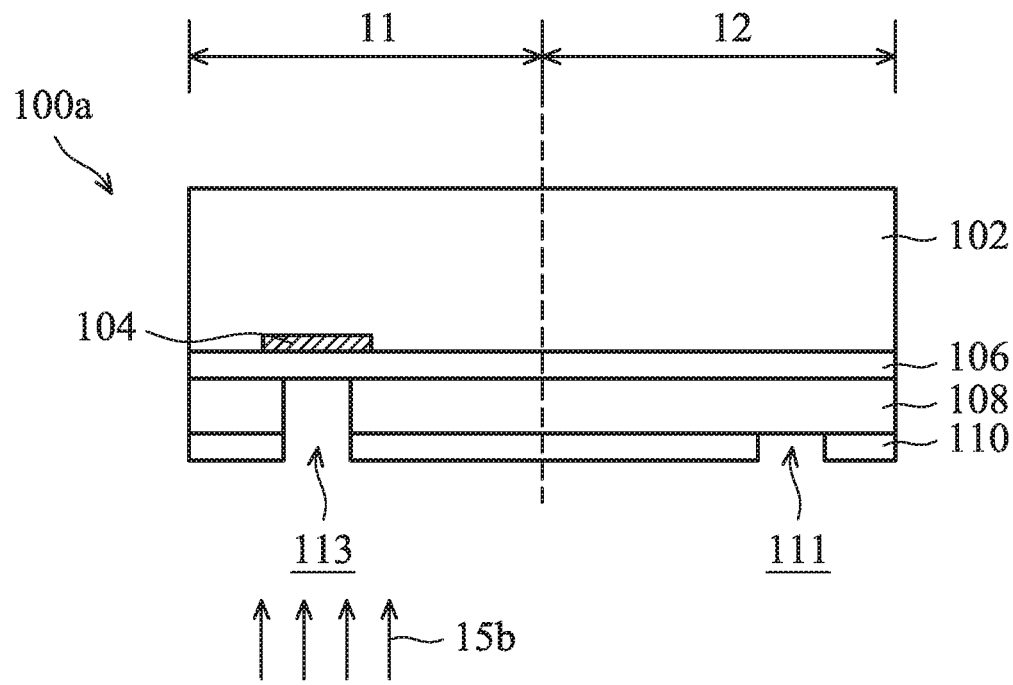

Subsequently, as shown in FIG. 1D, a portion of the oxide layer 108 is removed to extend the depth of the first trench 113, in accordance with some embodiments of the disclosure. The portion of the oxide layer 108 is removed by performing a second etching step 15b. The second etching process 15b stops until the top surface of the first etching stop layer 106 is exposed.

Figure 1E:
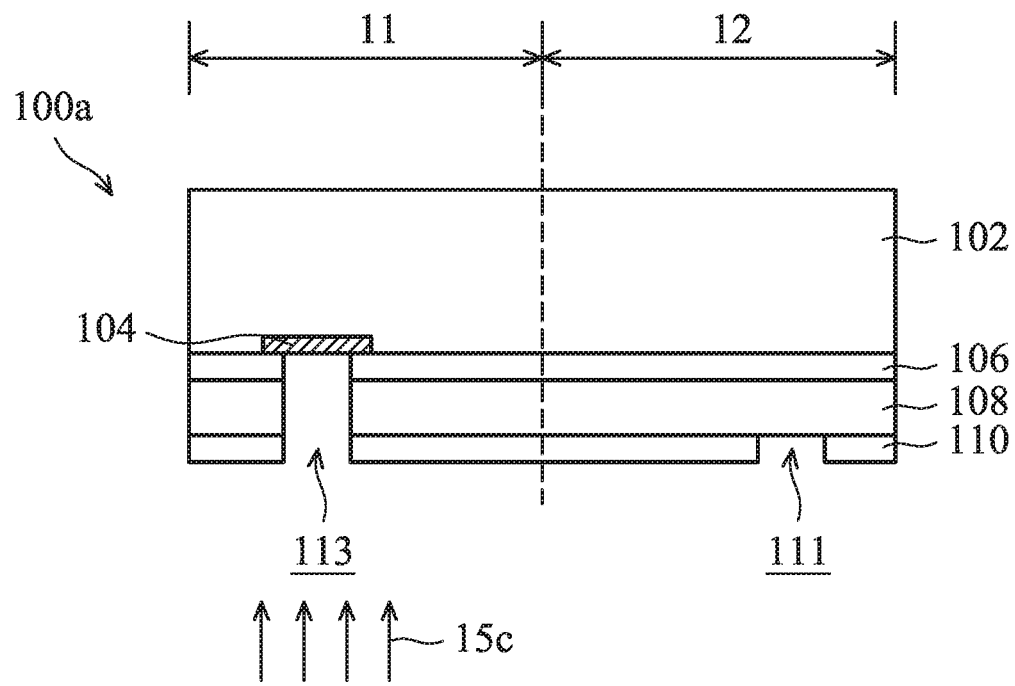

Next, as shown in FIG. 1E, a portion of the first etching stop layer 106 is exposed to further extend the depth of the first trench 113, in accordance with some embodiments of the disclosure. The portion of the first etching layer 106 is removed by performing a third etching step 15c. The first conductive layer 104 is exposed by the first trench 113, and therefore the first trench 113 is through the first etching stop layer 106, the first oxide layer 108 and the first bonding layer 110.

It should be noted that the etching process includes the first etching step 15a, the second etching step 15b and the third etching step 15c, and the first etching step 15a, the second etching step 15b and the third etching step 15c are performed in-situ. More specifically, the first etching step 15a, the second etching step 15b and the third etching step 15c are performed in the same reaction chamber without transferring to another chamber. Therefore, the risk of pollution of the semiconductor device 100a is reduced.

Figure 1F:
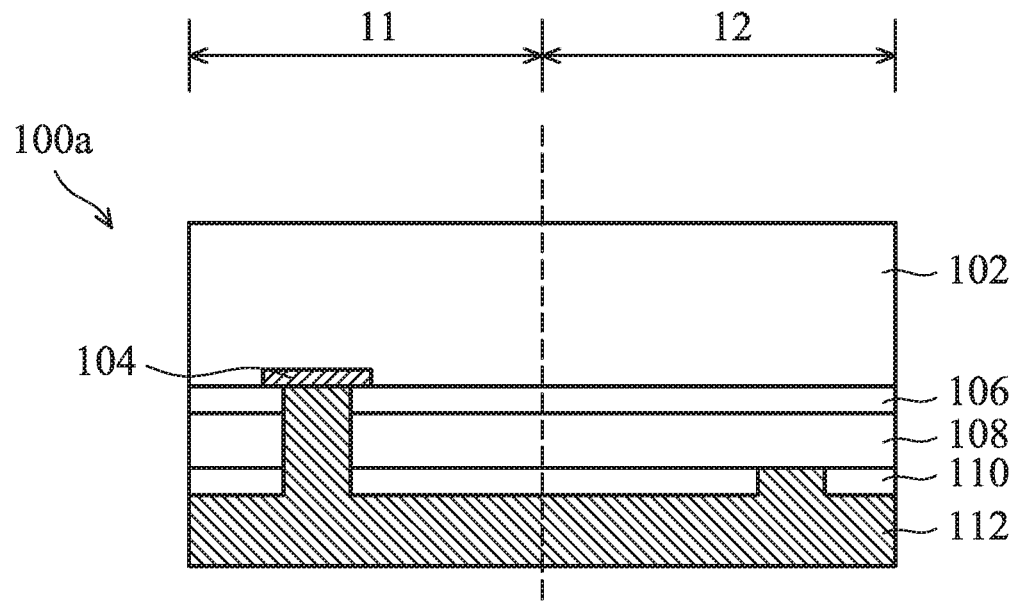

Afterwards, as shown in FIG. 1F, a conductive material 112 is formed in the first trench 113 in the first region 11 and in the recess 111 in the second region 12, in accordance with some embodiments of the disclosure.

The conductive material 112 may be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive material 112 is formed by a plating method.

Figure 1G:
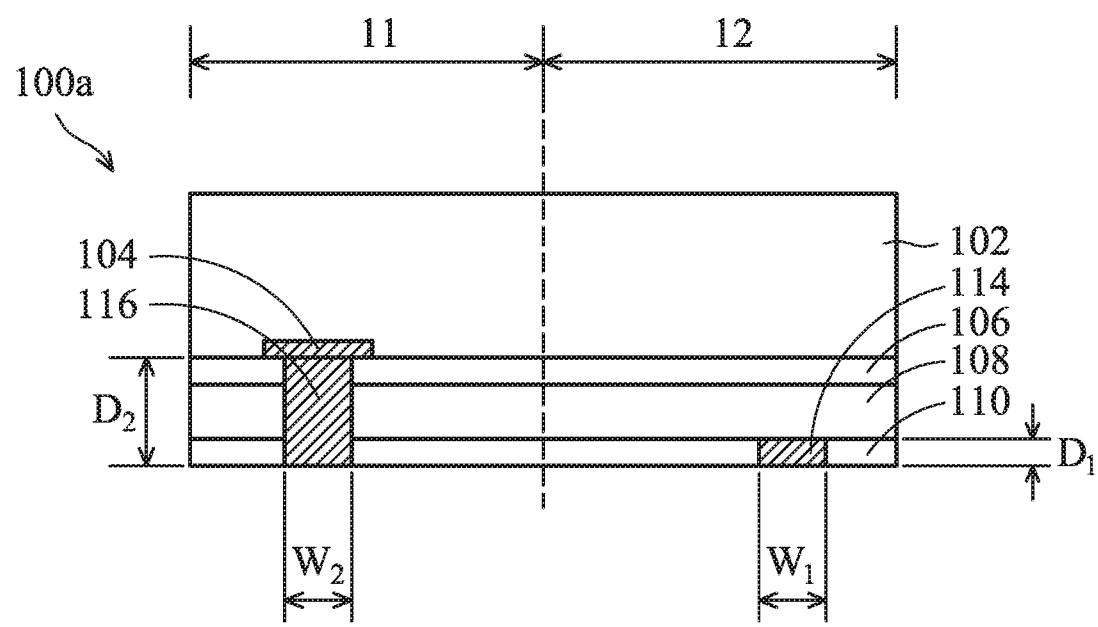

Next, as shown in FIG. 1G, a polishing process is performed on the conductive material 112 to planarize the top surface of the conductive material, in accordance with some embodiments of the disclosure. In some embodiments, the polishing process is a chemical mechanical polishing (CMP) process.

As a result, a first dummy pad 114 is formed in the second region 12 by filling the conductive material 112 in the recess 111. The first dummy pad 114 is not electrically connected to other device, and does not provide any function. The first dummy pad 114 is configured to reduce the loading effect during performing the polishing process, such as a CMP process.

For regions with different exposed areas (or etched areas), it is difficult to control etch uniformity due to the loading effect. Depending on the etching strategy, the loading effect is the etch rate for a larger area being either faster or slower than it is for a smaller area. In other words, the loading effect is that the etch rate in a large area is mismatched to the etch rate in a small area. This means that the loading effect may be affected by pattern density. If no dummy pad is formed in the second region 12 of the first substrate 102, the pattern density of the conductive materials in the second region 12 is smaller than that of the conductive materials in the first region 11 since a first bonding via 116 is formed in the first region 11 of the first substrate 102. The pattern density of the conductive materials for bonding in the first region 11 and the pattern density of the conductive materials in the first region 12 are not equal. Therefore, the top surface of the first bonding layer 110 after the CMP process may not be planar due to the loading effect. The first bonding layer 110 may have a protruding or recessed top surface. The bonding performance of the first bonding layer 110 and the second bonding layer 210 may be degraded due to the non-planar top surface. In order to improve the bonding performance, the first dummy pad 114 is formed in the second region 12 of the first substrate 102 to increase the pattern density in the second region 12.

The first bonding via 116 is formed in the first region 11 by filling the conductive material 112 in the first trench 113. The first bonding via 116 is through the first bonding layer 110, the first oxide layer 108 and the first etching stop layer 106. The first bonding via 116 is electrically connected to the first conductive layer 104 to transfer the signal to the interconnect structure in the first substrate 102.

It should be noted that the first bonding via 116 is in direct contact with the first conductive layer 104 without any line or via between the first bonding via 116 and the first conductive layer 104. The first bonding via 116 is only though one etching stop layer (such as the first etching stop layer 106).

The first dummy pad 114 has a first depth $D_1$ along a vertical direction and a first width $W_1$ along a horizontal direction. In some embodiments, the first depth $D_1$ is in a range from about 0.1 µm to about 7 µm. In some embodiments, the first width $W_1$ is in a range from about 0.01 µm to about 200 µm.

The first bonding via 116 has a second depth $D_2$ along a vertical direction and a second width $W_2$ along a horizontal direction. The second width $W_2$ is substantially equal to the first width $W_1$. The second depth $D_2$ is greater than the first depth $D_1$. In some embodiments, the second depth $D_2$ is in a range from about 3 µm to about 20 µm. In some embodiments, the second width $W_2$ is in a range from about 0.01 µm to about 200 µm. The first bonding via 116 has a substantially constant second width $W_2$ from the top surface to the bottom surface.

Figure 1H:
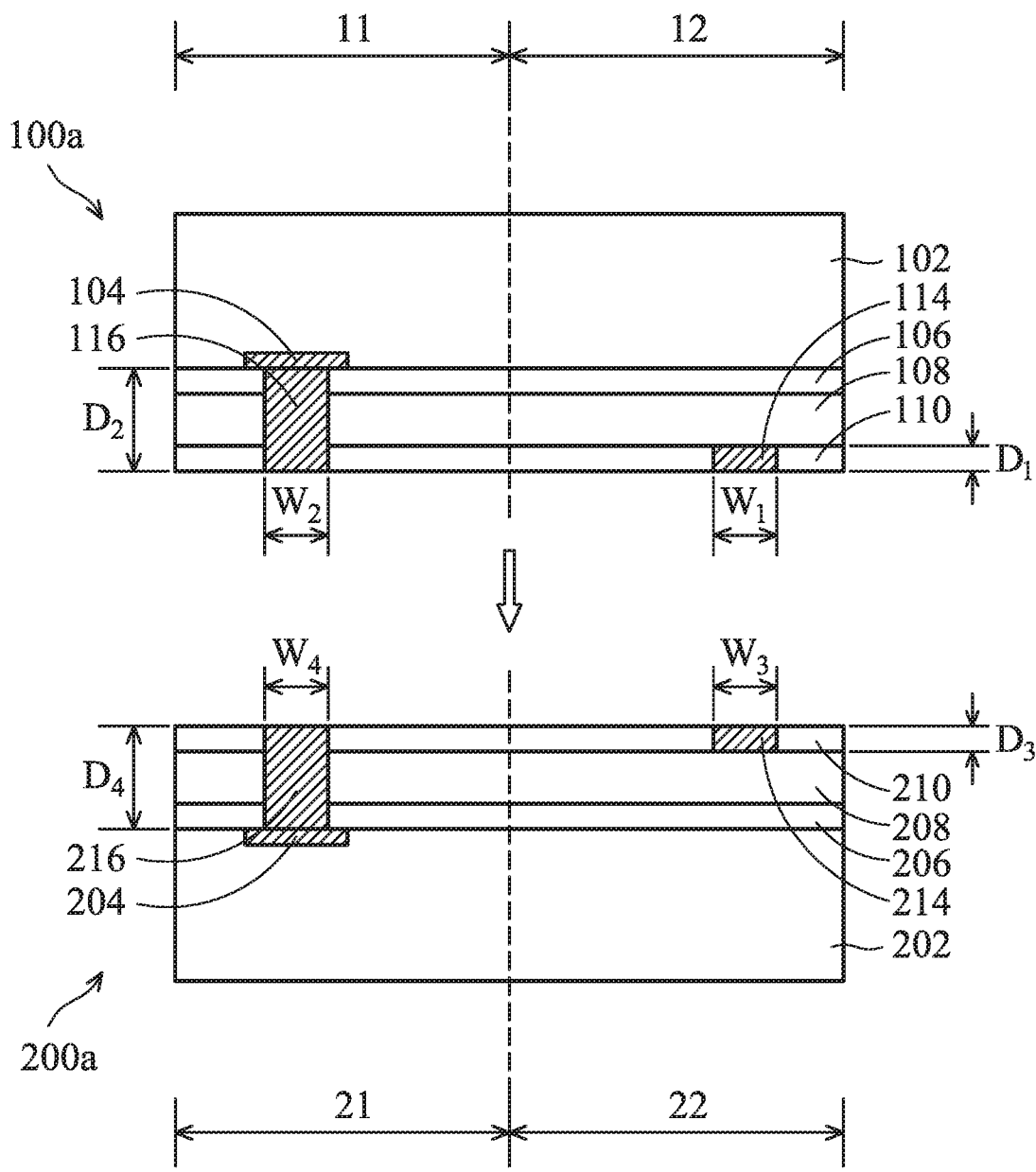

Subsequently, as shown in FIG. 1H, a second semiconductor device 200a is provided, in accordance with some embodiments of the disclosure. The second semiconductor device 200a is similar to the first semiconductor device 100a. In some embodiments, the first semiconductor device 100a is an image sensor device, and the second semiconductor device 200a is a logic device, such as application specific IC (ASIC).

The second semiconductor device 200a includes a second substrate 202, and the second substrate 202 includes a first region 21 and a second region 22. In some embodiments, the first region 21 is a second interconnect region, and the second region 22 is a logic region. A second etching stop layer 206 is formed over the second substrate 202, and the second oxide layer 208 is formed over the second etching stop layer 206. A second bonding layer 320 is formed over the second oxide layer 208.

A second conductive layer 204 is formed in the first region 21 of the second substrate 202. A second dummy pad 214 is formed in the second bonding layer 210 in the second region 22 of the second substrate 202, and a second bonding via 216 is formed through the second bonding layer 210, the second oxide layer 208 and the second etching stop layer 206 in the first region 21 of the second substrate 202.

It should be noted that the second bonding via 216 is only though one etching stop layer 206 which is in direct contact with the second conductive layer 204. The second bonding via 216 is electrically connected to and in direct contact with the second conducive layer 204. No conductive line or conductive via is between the second bonding via 216 and the second conducive layer 204. The second bonding via 216 is formed by performing a single etching process including multiple etching steps, and the single etching process is performed in a reaction chamber without transferring to another chamber.

The first bonding via 116 faces the second bonding via 216, and the first dummy pad 114 faces the second dummy pad 214. Before performing the hybrid bonding process, a pre-cleaning process may be performed on the top surface of the first bonding layer 110 and/or the top surface of the second bonding layer 210.

The second dummy pad 214 has a third depth $D_3$ along a vertical direction and a third width $W_3$ along a horizontal direction. In some embodiments, the third depth $D_3$ is in a range from about 0.1 µm to about 7 µm. In some embodiments, the third width $W_3$ is in a range from about 0.01 µm to about 200 µm. The second bonding via 216 has a fourth depth $D_4$ along a vertical direction and a fourth width $W_4$ along a horizontal direction. In some embodiments, the fourth depth $D_4$ is in a range from about 3 µm to about 20 µm. In some embodiments, the fourth width $W_4$ is in a range from about 0.01 µm to about 200 µm. The second bonding via 216 has a substantially constant fourth width $W_4$ from the top surface to the bottom surface.

The first width $W_1$ of the first dummy pad 114 is substantially the same as the third width $W_3$ of the second dummy pad 214 to facilitate the bonding alignment. Similarly, the second width $W_2$ of the first bonding via 116 is substantially the same as the fourth width $W_4$ of the second bonding via 216 to facilitate the bonding alignment.

Figure 1I:
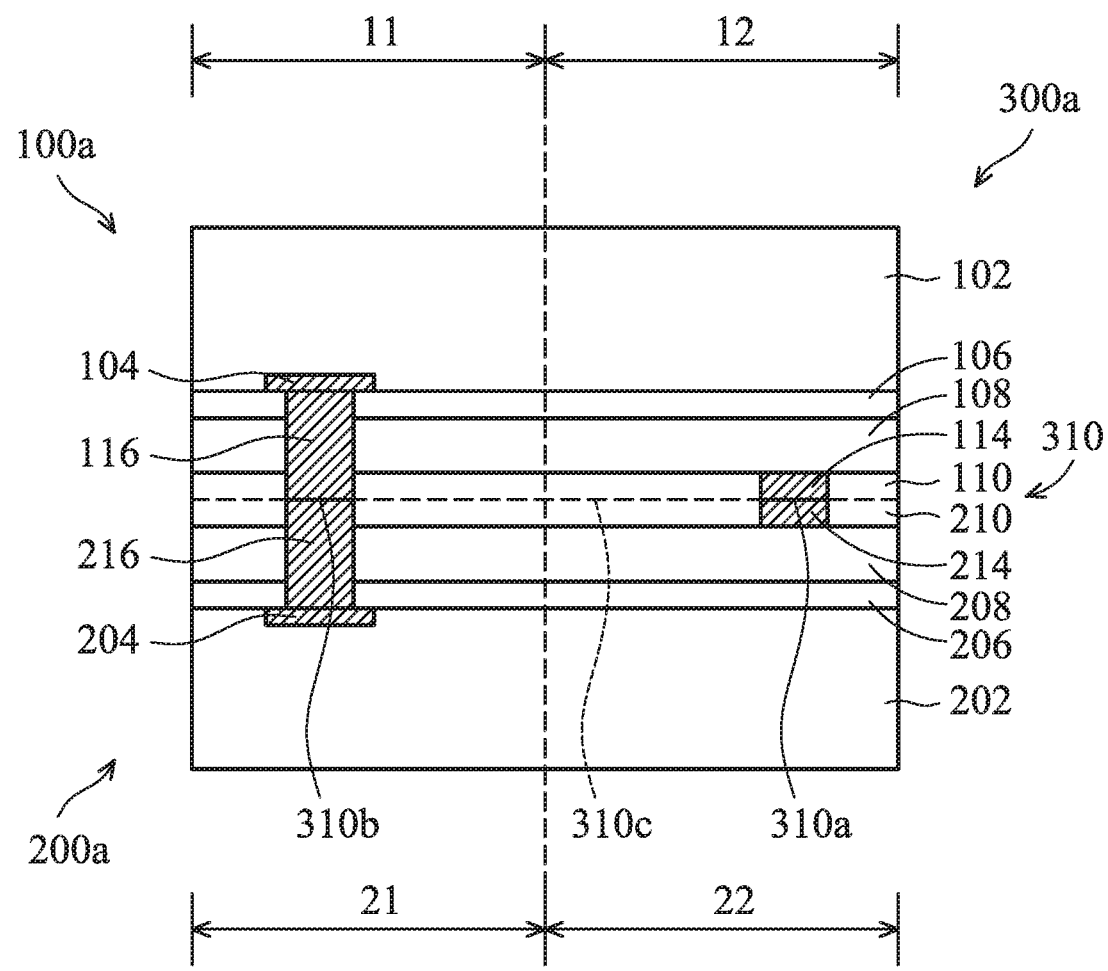

Next, as shown in FIG. 1I, the first semiconductor device 100a is bonded to the second semiconductor device 200a by bonding the first bonding layer 110 and the second bonding layer 210 to form the semiconductor structure 300a, in accordance with some embodiments of the disclosure. The semiconductor structure 300 is a 3DIC stacking structure. The bonding is performed using a hybrid bonding process.

The hybrid bonding process involves at least two types of bonding, including metal-to-metal bonding and non-metal-to-non-metal bonding. A hybrid bonding structure 310 is formed between the first semiconductor device 100a and the second semiconductor device 200a. The hybrid bonding structure 310 includes the first bonding via 116 and the second bonding via 216 bonded by the metal-to-metal bonding and the first dummy pad 114 and the second dummy pad 214 bonded by the metal-to-metal bonding. In addition, the first bonding layer 110 and the second bonding layer 210 are bonded by non-metal-to-non-metal bonding. It should be noted that since the first bonding layer 110 and the second bonding layer 210 both are not made of oxide, no oxide-to-oxide bonding layer is between the first bonding layer 110 and the second bonding layer 210.

In some embodiments, the hybrid bonding process may be performed in an inert environment, such as an environment filled with inert gas including $N_2$, Ar, He, or combinations thereof. After the hybrid bonding process, a thermal process is performed on the semiconductor device structure 300.

The bonding structure 310 has a first metallic bonding interface 310a between the first bonding via 116 and the second bonding via 216, and a second metallic bonding interface 310b between the first dummy pad 114 and the second dummy pad 214. The bonding structure 310 may not have a clear non-metallic interface 310c (represented by dash line) between the first bonding layer 110 and the second bonding layer 210 due to the thermal process.

The bonding strength between the first semiconductor device 100a and the second semiconductor device 200a is improved since both of the first bonding layer 110 and the second bonding layer 210 have planar top surface. Therefore, the delamination problem may be avoided, and the bonding performance is improved. In addition, the dishing or protrusion problems resulting from a CMP process are resolved or greatly reduced.

Figure 2:
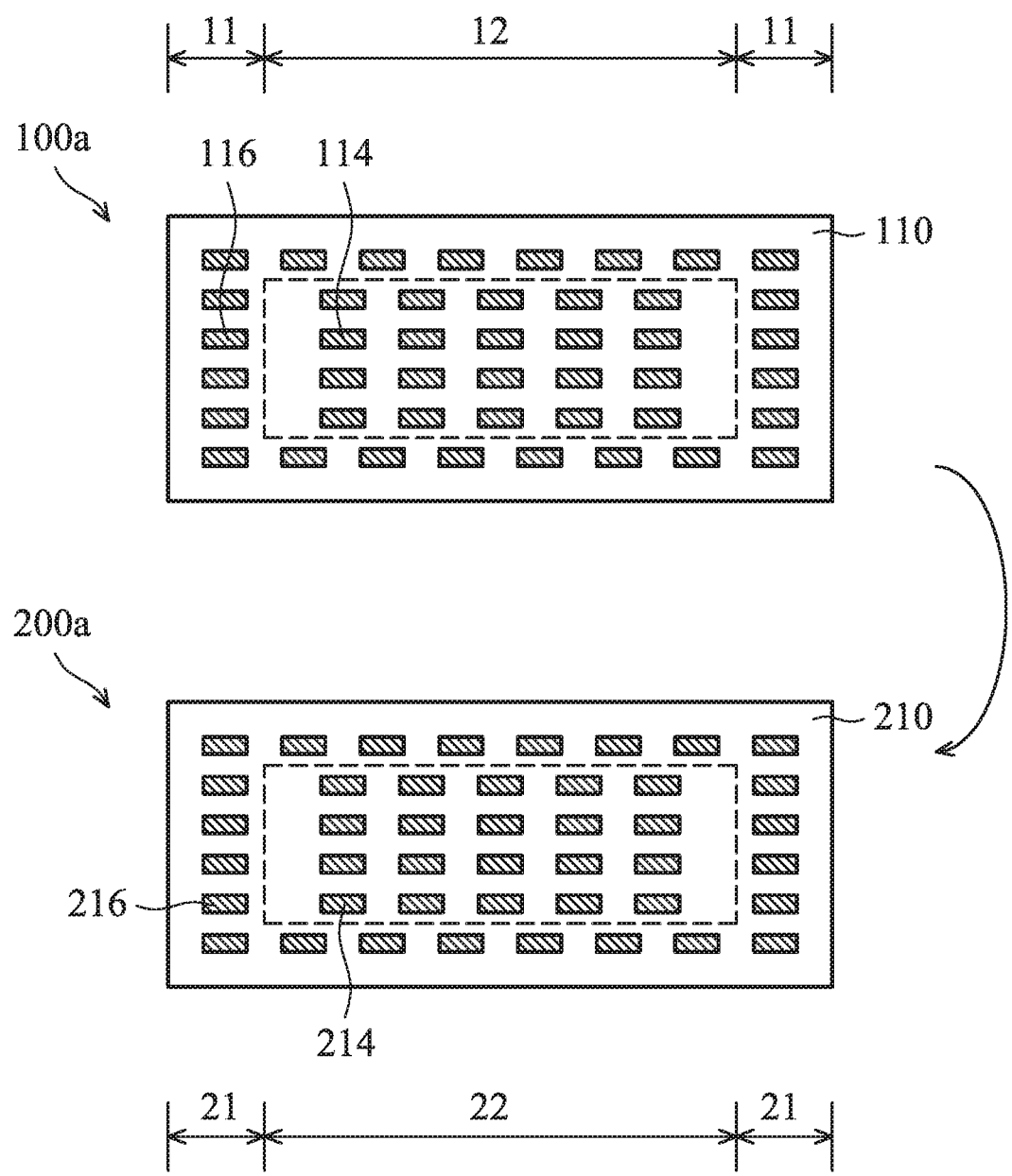
FIG. 2 shows a top-view representation of the first dummy pad, the first bonding via, the second dummy pad and the second bonding via of FIG. 1H, in accordance with some embodiments of the disclosure.

FIG. 2 shows a top-view representation of the first dummy pad 114, the first bonding via 116, the second dummy pad 214 and the second bonding via 216 of FIG. 1H, in accordance with some embodiments of the disclosure.

In the first semiconductor device 100a, 100b, the second region 12 is at the center of the first substrate 102, and the first region 11 surrounds the second region 12. The first region 11 is used to form various redistribution layers (RDL) to transfer the signal of the devices in the second region 12 to the outer environment. The first dummy pad 114 in the second region 12 is surrounded by the first bonding via 116 in the first region 11 when seen from a top-view.

Similarly, in the second semiconductor device 200a, 200b, the second region 22 is at the center of the second substrate 202. The second dummy pad 214 in the second region 22 is surrounded by the second bonding via 216 in the first region 21 when seen from a top-view.

Figure 3A:
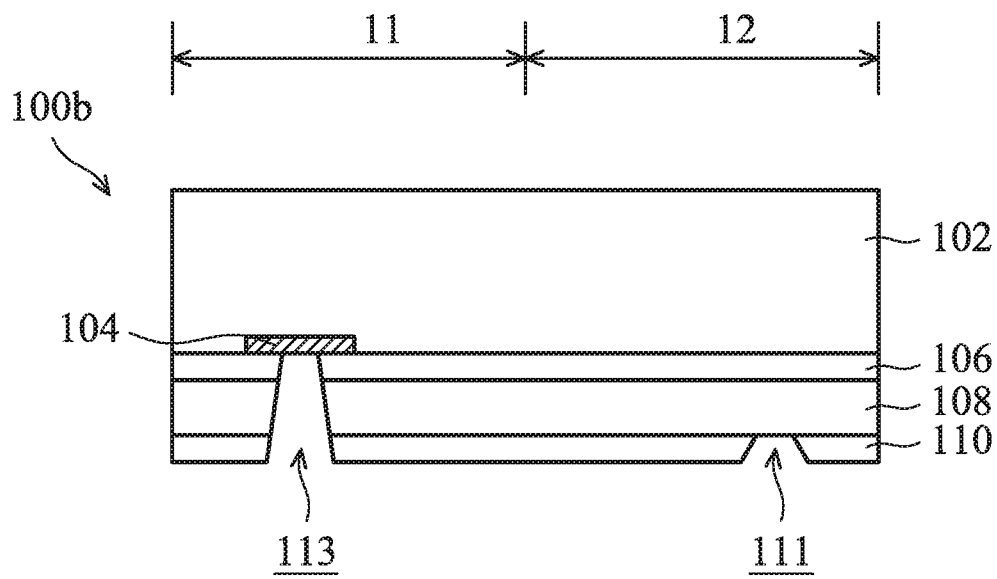
FIGS. 3A-3C show cross-sectional representations of forming a semiconductor structure, in accordance with some embodiments of the disclosure.
Figure 3B:
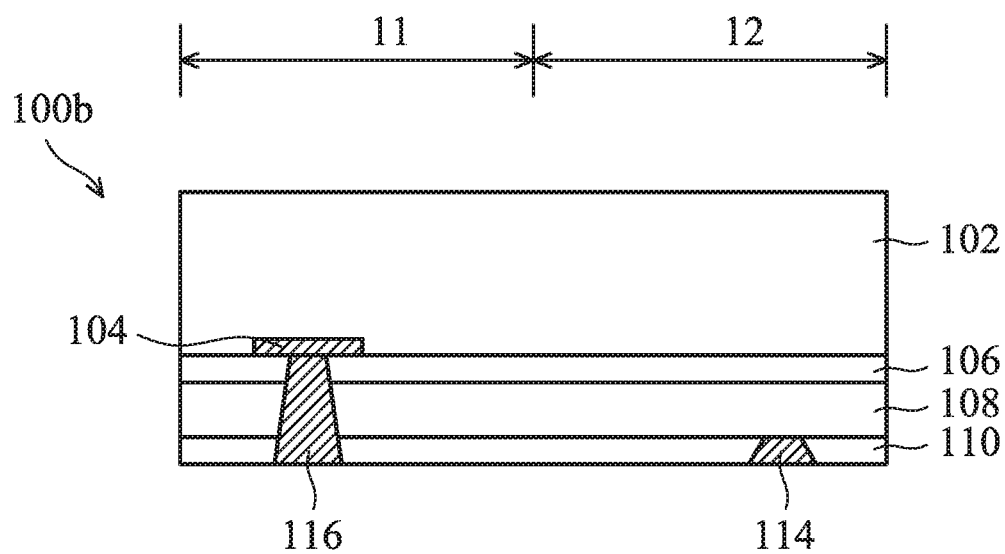
Figure 3C:
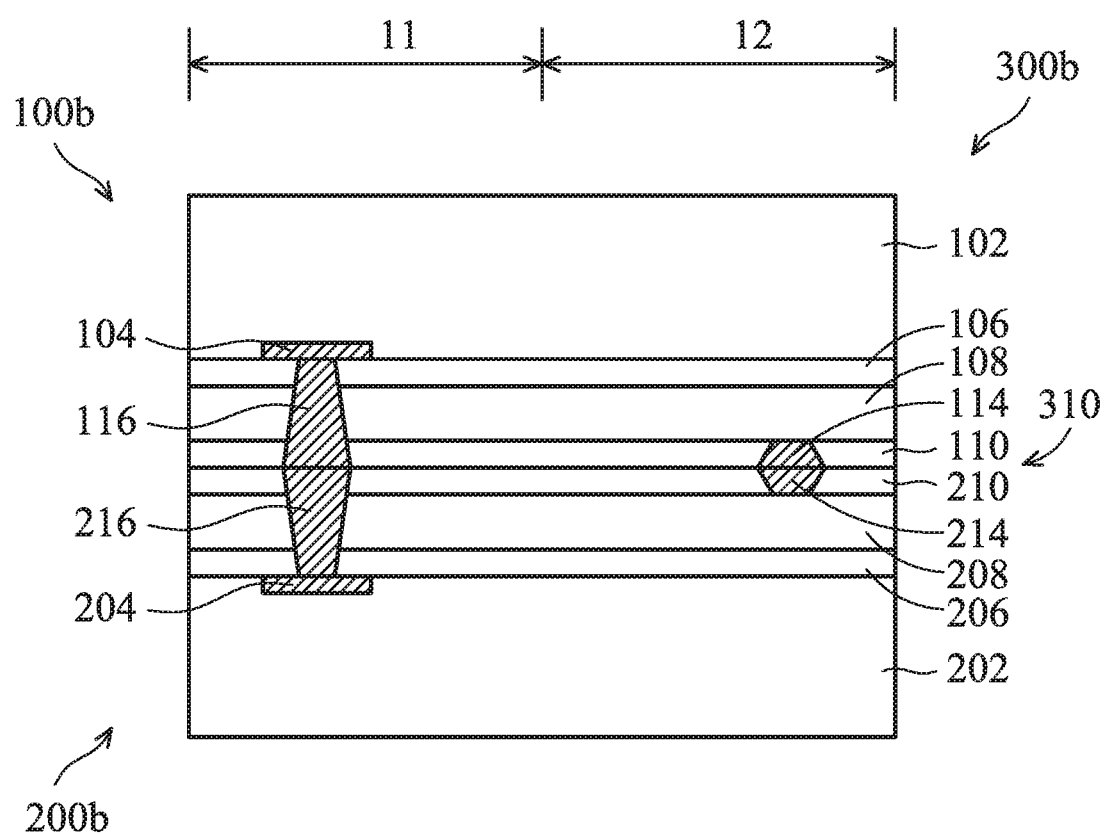

FIGS. 3A-3C show cross-sectional representations of forming a semiconductor structure 300b, in accordance with some embodiments of the disclosure. Some processes and materials used to form the semiconductor structure 300b in FIGS. 3A-3C are similar to, or the same as, those used to form the semiconductor device structure 300a in FIGS. 1A-1I and are not repeated herein.

The semiconductor structure 300b in FIGS. 3A-3C is similar to the semiconductor structure 300a in FIGS. 1A-1I, and the difference is that the shape of the first bonding via 116 is different than the shape of the second bonding via 216.

As shown in FIG. 3A, the first recess 111 is formed in the first bonding layer 110, and the first recess 111 has a width that is tapered from the top surface to the bottom surface. The first trench 113 is formed through the first bonding layer 110, the first oxide layer 108 and the first etching stop layer 106. The top surface of the first conductive layer 104 is exposed by the first trench 113. The first trench 113 has a width that is tapered from the top to the bottom.

Afterwards, as shown in FIG. 3B, the conductive material is formed in the first recess 111 and the first trench 113 to form the first dummy pad 114 in the second region 12 and the first bonding via 116 in the first region 11, respectively, in accordance with some embodiments of the disclosure.

The first bonding via 116 is electrically connected to the first conductive layer 104. The first bonding via 116 has a width that is tapered from the top surface to the bottom surface, and the bottom surface is closer to the first substrate 102 than the top surface.

Next, as shown in FIG. 3C, the first semiconductor device 100b is bonded to the second semiconductor device 200b by bonding the first bonding layer 110 and the second bonding layer 210 to form the semiconductor structure 300b, in accordance with some embodiments of the disclosure. The second semiconductor device 200b includes the second dummy pad 214 in the second region 12, and the second bonding via 216 in the first region 11. The semiconductor structure 300b is a 3DIC stacking structure. The bonding is performed using a hybrid bonding process.

The hybrid bonding structure 310 is formed between the first semiconductor device 100b and the second semiconductor device 200b. The shape of the first bonding via 116 is symmetric to the shape of the second bonding via 216 relative to the central interface, and the shape of the first dummy pad 114 is symmetric to the shape of the second dummy pad 214 relative to the central interface.

The hybrid bonding structure 310 includes the first bonding via 116 and the second bonding via 216 bonded by the metal-to-metal bonding and the first dummy pad 114 and the second dummy pad 214 bonded by the metal-to-metal bonding. In addition, the first bonding layer 110 and the second bonding layer 210 are bonded by non-metal-to-non-metal bonding.

FIGS. 4A-4D show perspective representations of the arrangement or layout of the first dummy pad 114 and the second dummy pad 214, in accordance with some embodiments of the disclosure.

Figure 4A:
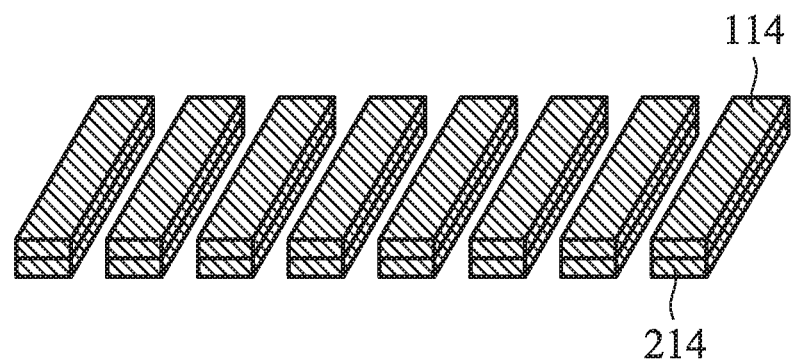
FIGS. 4A-4D show perspective representations of the arrangement or layout of the first dummy pad and the second dummy pad, in accordance with some embodiments of the disclosure.

As shown in FIG. 4A, the first dummy pad 114 overlaps the second dummy pad 214. A right sidewall surface of the first dummy pad 114 is aligned with a right sidewall surface of the second dummy pad 214.

Figure 4B:
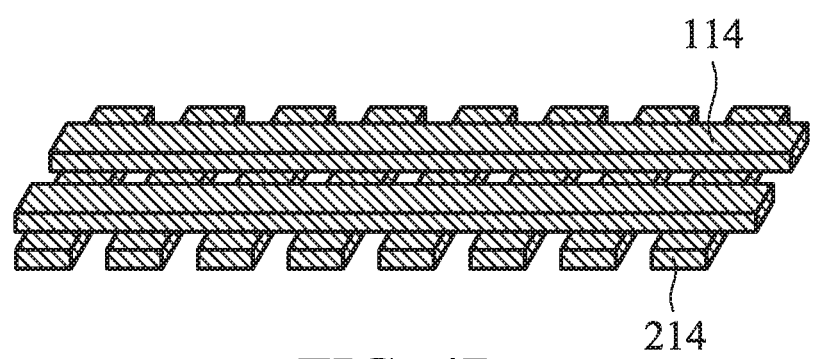

As shown in FIG. 4B, the first dummy pad 114 is orthogonal to the second dummy pad 214. A portion of the first dummy pad 114 overlaps a portion of the second dummy pad 214. Since the pattern density of the conductive material in the second region 12 is increased by forming the first dummy pad 114 to reduce the loading effect, the planar top surfaces of the first bonding layer 110 and the second bonding layer 210 are obtained after performing a polishing process (such as CMP process). The planar top surface is provided to enhance the bonding strength between the first bonding layer 110 and the second bonding layer 210. Therefore, even if the overall area of first dummy pad 114 does not overlap the overall area of the second dummy pad 214, and the bonding strength between the first semiconductor device 100a, 100b the second semiconductor device 200a, 200b is still good enough to prevent delamination. In some embodiments, the amount of overlap between the first dummy pad 114 and the second dummy pad 214 is in a range from about 30% to about 100%. When the amount of overlap is within the above-mentioned range, the bonding strength between the first semiconductor device 100a, 100b and the second semiconductor device 200a, 200b is good.

Figure 4C:
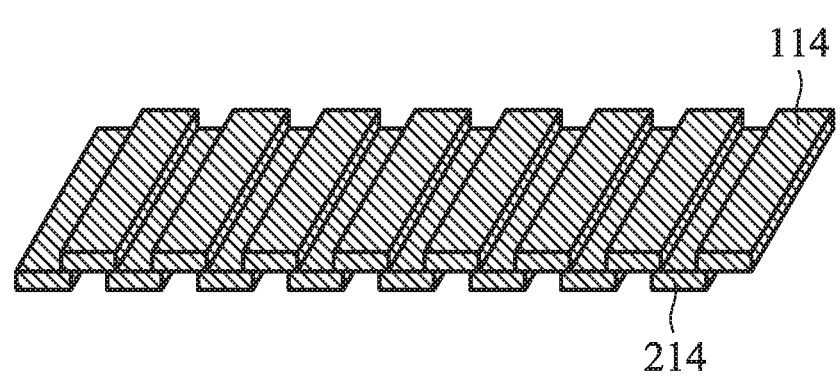

As shown in FIG. 4C, one first dummy pad 114 may overlap two adjacent second dummy pads 214. The first dummy pad 114 may cross two adjacent second dummy pads 214.

Figure 4D:
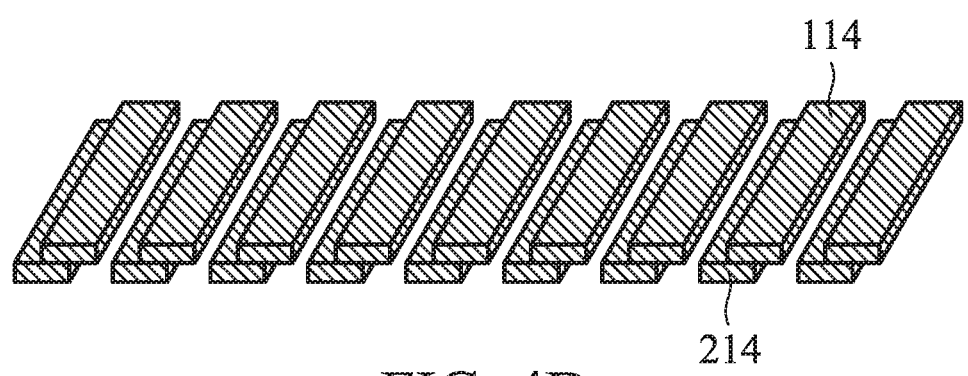

As shown in FIG. 4D, a portion of the first dummy pad 114 overlaps a portion of the second dummy pad 214. More specifically, a left sidewall surface of the first dummy pad 114 is not aligned with a left sidewall surface of the second dummy pad 214. There is a space between the left sidewall surface of the first dummy pad 114 and the left sidewall surface of the second dummy pad 214. In some embodiments, the first dummy pad 114 may overlap half of the second dummy pad 214.

FIGS. 5A-5D show cross-sectional representations of forming a semiconductor structure 700, in accordance with some embodiments of the disclosure. The semiconductor structure 700 is formed by hybrid bonding a first semiconductor device 500 and a second semiconductor device 600.

Figure 5A:
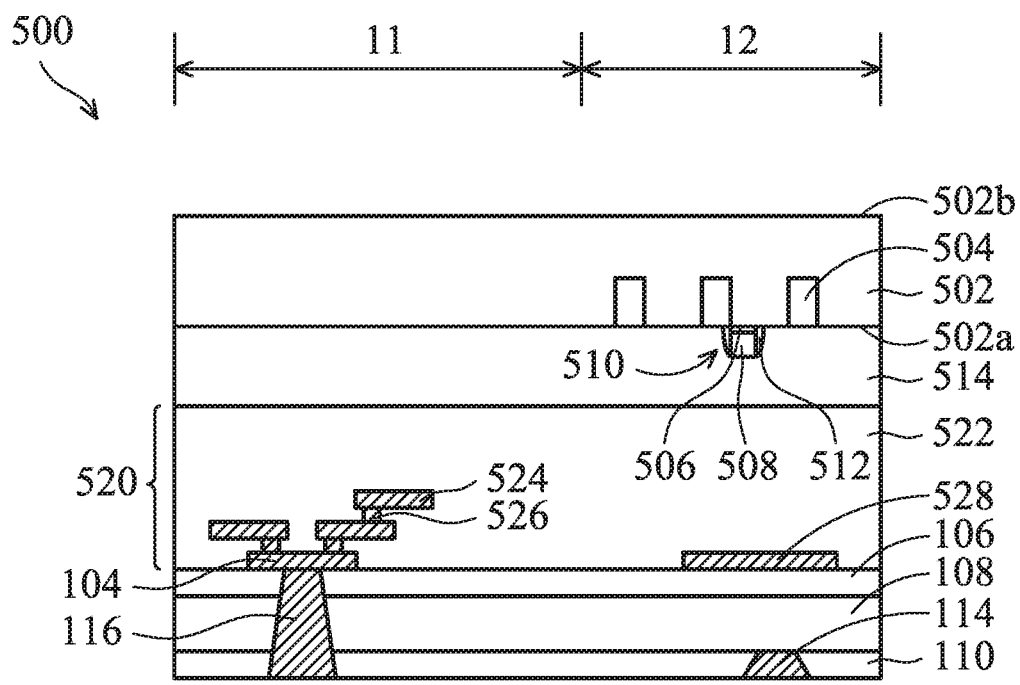
FIGS. 5A-5D show cross-sectional representations of forming a semiconductor structure, in accordance with some embodiments of the disclosure.

As shown in FIG. 5A, the first semiconductor device 500 includes a first substrate 502. The first substrate 502 includes a first surface 502a and a second surface 502b. The first substrate 502 includes a first region 11 and a second region 12. In some embodiments, the first semiconductor device 500 is a backside illuminated (BSI) image sensor device. In some embodiments, the first region 11 is a first interconnect region, and the second region 12 is a pixel region.

A number of light-sensing regions 504 are formed in the first substrate 502. The light-sensing region 504 is used to detect the intensity (brightness) of red, green and blue light wavelengths, respectively. In some embodiments, the light-sensing region 504 is a photodiode (PD) region. The light-sensing region 504 may be doped with dopants. In some embodiments, the first substrate 502 is doped with a first conductivity type, and the light-sensing region 504 is doped with a second conductivity type. In some embodiments, the first substrate 502 is doped with p-type dopants, such as boron (B) or gallium (Ga), and the light-sensing region 504 is doped with n-type dopants, such as phosphorus (P) or arsenic (As).

A transistor device 510 is formed over the first surface 502a of the first substrate 502. The transistor device 110 includes a gate dielectric layer 506 and a gate electrode layer 508 over the gate dielectric layer 506. A pair of gate spacers 512 are formed on sidewall surfaces of the transistor device 510. In some embodiments, the transistor device 510 is a transfer transistor device.

The gate dielectric layer 506 is made of dielectric materials, such as silicon oxide, silicon nitride, silicon oxynitride, dielectric material with high dielectric constant (high-k), or a combination thereof. The gate dielectric layer 506 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). The gate electrode layer 508 may be made of conductive material, such as aluminum (Al), copper (Cu), tungsten (W), titanium (Ti), tantalum (Ta), or another applicable material. The first gate electrode layer 508 may be formed by a deposition process, such as chemical vapor deposition (CVD), physical vapor deposition (PVD), atomic layer deposition (ALD), or another applicable process.

In some embodiments, the gate spacers 512 are made of silicon oxide, silicon nitride, silicon oxynitride or other applicable material. In some embodiments, the gate spacers 112 are formed by a chemical vapor deposition (CVD) process or physical vapor deposition (PVD) process.

In some embodiments, four n-type MOS transistors are formed. The four n-type MOS transistors are: a transfer transistor Tx for transferring optical charges collected at the photodiode to a floating diffusion (FD) region; a reset transistor Rx for setting the electrical potential of the floating diffusion (FD) region to a preferable level and resetting the floating diffusion (FD) region after discharging charges; a drive transistor Dx for functioning as a source follower buffer amplifier; and a select transistor Sx for performing a switching function to address the pixel.

An inter-layer dielectric (ILD) layer 514 is formed over the first surface 102a of the first substrate 502. The ILD layer 514 may include multilayers. The ILD layer 514 is made of silicon oxide (SiOx), silicon nitride (SixNy), silicon oxynitride (SiON), low-k dielectric material, or another applicable dielectric material.

A first interconnect structure 520 is formed over the ILD layer 514. The first interconnect structure 520 includes an inter-metal dielectric (IMD) layer 522, a conductive line 524, a conductive via plug 526, and a metal block structure 528. The metal block structure 528 is not electrically connected to the first dummy pad 114. The IMD layer 522 may be a single layer or multiple layers. The metal block structure 528 and the first conductive layer 104 are at the same level. The conductive line 524 and the conductive via plug 526 are formed in the IMD layer 522. The conductive line 524 is electrically connected to another adjacent conductive line 524 through the conductive via plug 526. The first interconnect structure 120 is formed in a back-end-of-line (BEOL) process.

The IMD layer 522 is made of silicon oxide (SiOx), silicon nitride (SixNy), silicon oxynitride (SiON), dielectric material(s) with low dielectric constant (low-k), or combinations thereof. In some embodiments, the IMD layer 522 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 522 is deposited by a plasma enhanced chemical vapor deposition (PECVD) process or by a spin coating process.

The conductive line 524, the conductive via plug 526 and the metal block structure 528 are independently made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive line 524, the conductive via plug 526 and the metal block structure 528 are formed by a plating method.

The first etching stop layer 106 is formed on the first interconnect structure 520, and the first oxide layer 108 is formed on the first etching stop layer 106. The first bonding layer 110 is formed on the first oxide layer 108. The first dummy pad 114 is formed in the first bonding layer 110, and the first bonding via 116 is formed through multiple layers including the first bonding layer 110, the first oxide layer 108 and the first etching stop layer 106. The first bonding via 116 is electrically connected to the first conductive layer 104 (or the top metal layer) of the first interconnect structure 520.

Figure 5B:
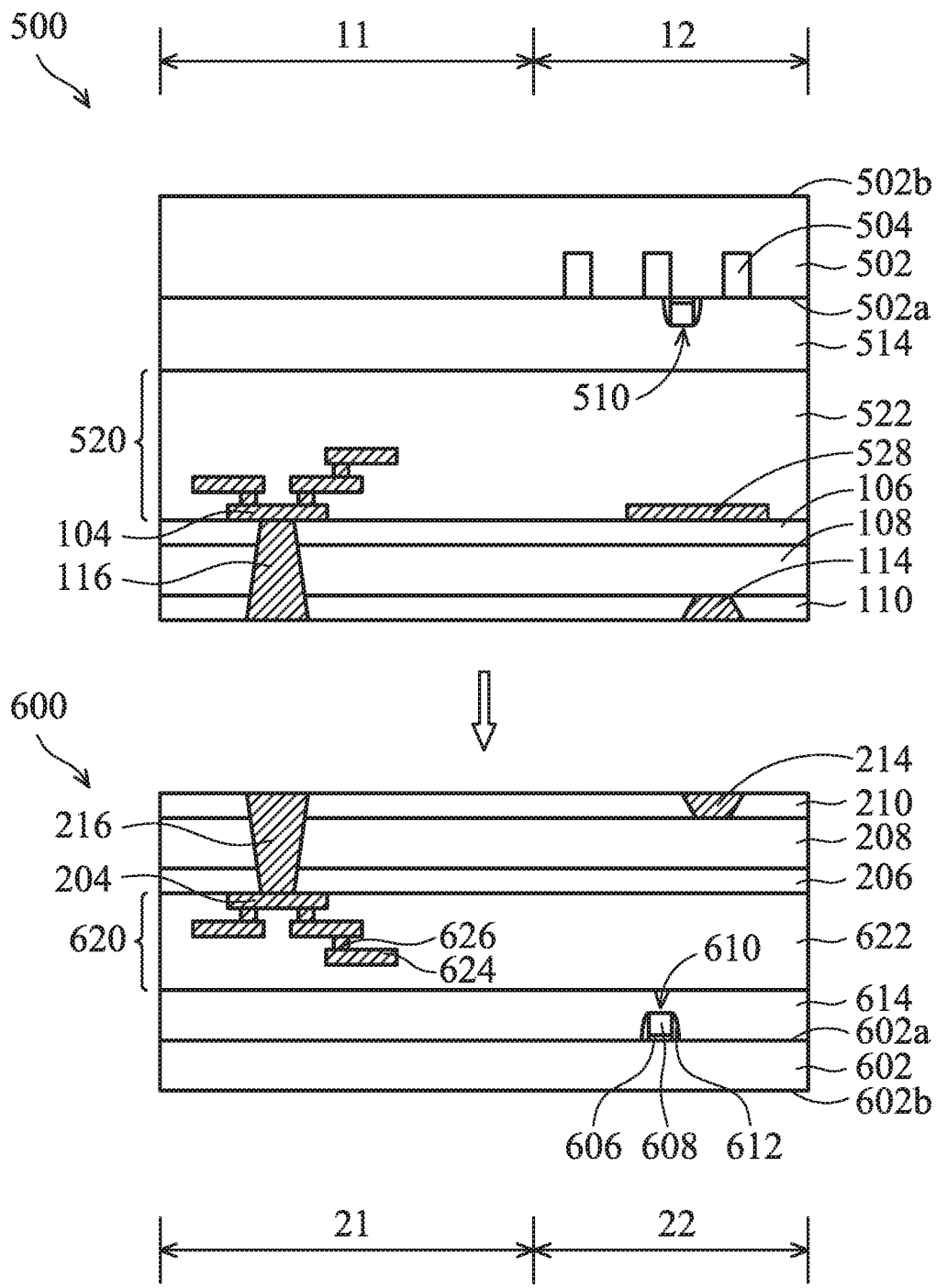

Afterwards, as shown in FIG. 5B, the second semiconductor device 600 is disposed oppositely to the first semiconductor device 500, in accordance with some embodiments of the disclosure. In some embodiments, the second semiconductor device 600 is a logic device.

The second semiconductor device 600 includes a second substrate 602. The second substrate 602 includes a first surface 602a and a second surface 602b. The second substrate 602 includes a first region 21 and a second region 22. In some embodiments, the second semiconductor device 600 is a logic device. In some embodiments, the first region 21 is a second interconnect region, and the second region 22 is a logic region.

A transistor device 610 is formed over the first surface 602a of the second substrate 602. The transistor device 610 includes a gate dielectric layer 606 and a gate electrode layer 608 over the gate dielectric layer 606. A pair of gate spacers 612 are formed on sidewall surfaces of the transistor device 610.

An inter-layer dielectric (ILD) layer 614 is formed over the first surface 602a of the second substrate 602. A second interconnect structure 620 is formed over the ILD layer 614. The second interconnect structure 620 includes an inter-metal dielectric (IMD) layer 622, a conductive line 624 and a conductive via plug 626. The IMD layer 622 may be a single layer or multiple layers. The conductive line 624 and the conductive via plug 626 are formed in the IMD layer 622. The conductive line 624 is electrically connected to another adjacent conductive line 624 through the conductive via plug 626. The second interconnect structure 620 is formed in a back-end-of-line (BEOL) process.

The second etching stop layer 206 is formed on the second interconnect structure 620, and the second oxide layer 208 is formed on the first etching stop layer 206. The second bonding layer 610 is formed on the second oxide layer 608. The second dummy pad 214 is formed in the second bonding layer 210, and the second bonding via 216 is formed through multiple layers including the second bonding layer 210, the second oxide layer 208 and the second etching stop layer 206. The second bonding via 216 is electrically connected to the conductive layer 204 (or the top metal layer) of the second interconnect structure 620.

Figure 5C:
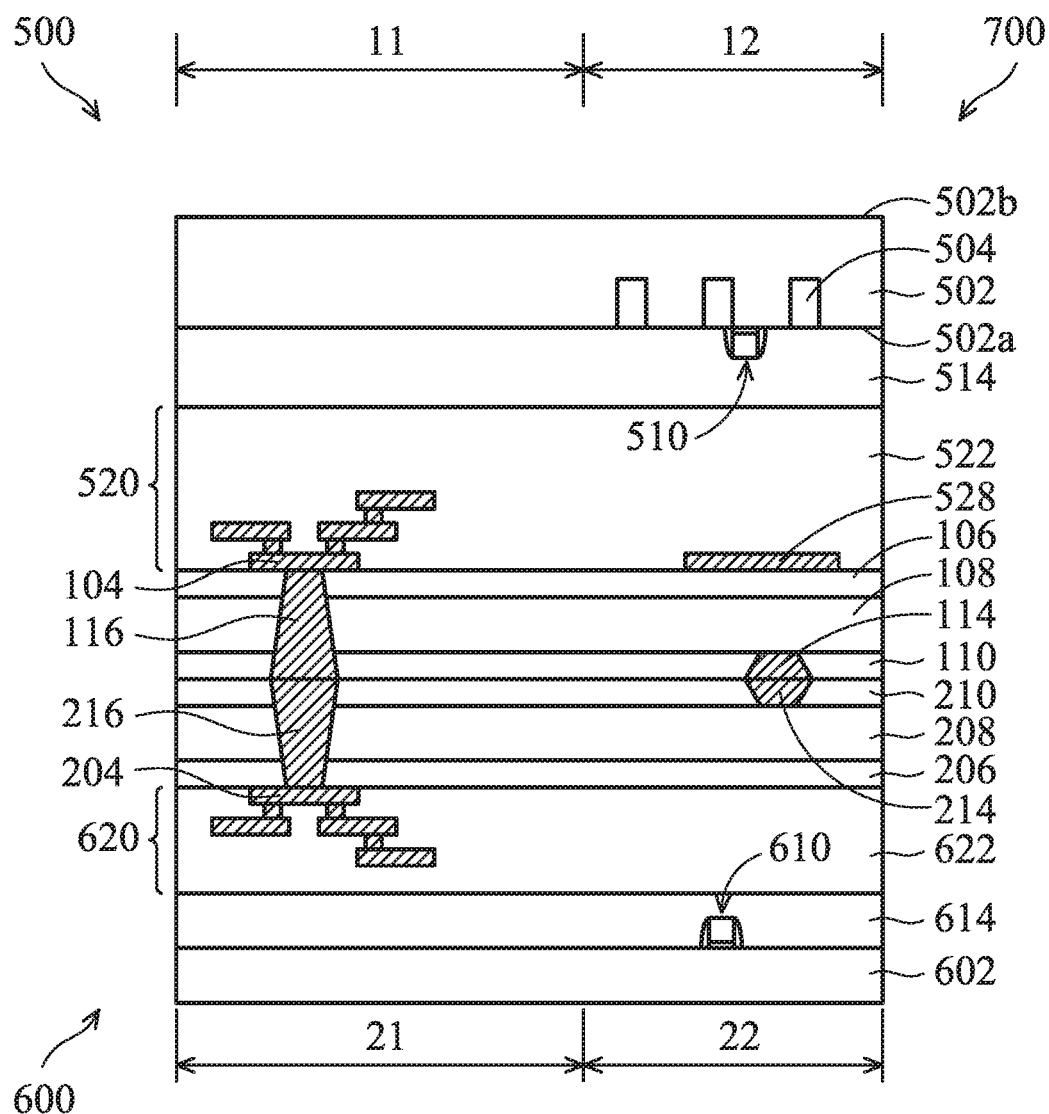

Next, as shown in FIG. 5C, the first semiconductor device 500 is bonded to the second semiconductor device 600 by a hybrid bonding process to form the semiconductor structure 700, in accordance with some embodiments of the disclosure. The semiconductor structure 700 is a 3DIC. The first dummy pad 114 is bonded to the second dummy pad 214, and the first bonding via 116 is bonded to the second bonding via 216.

Figure 5D:
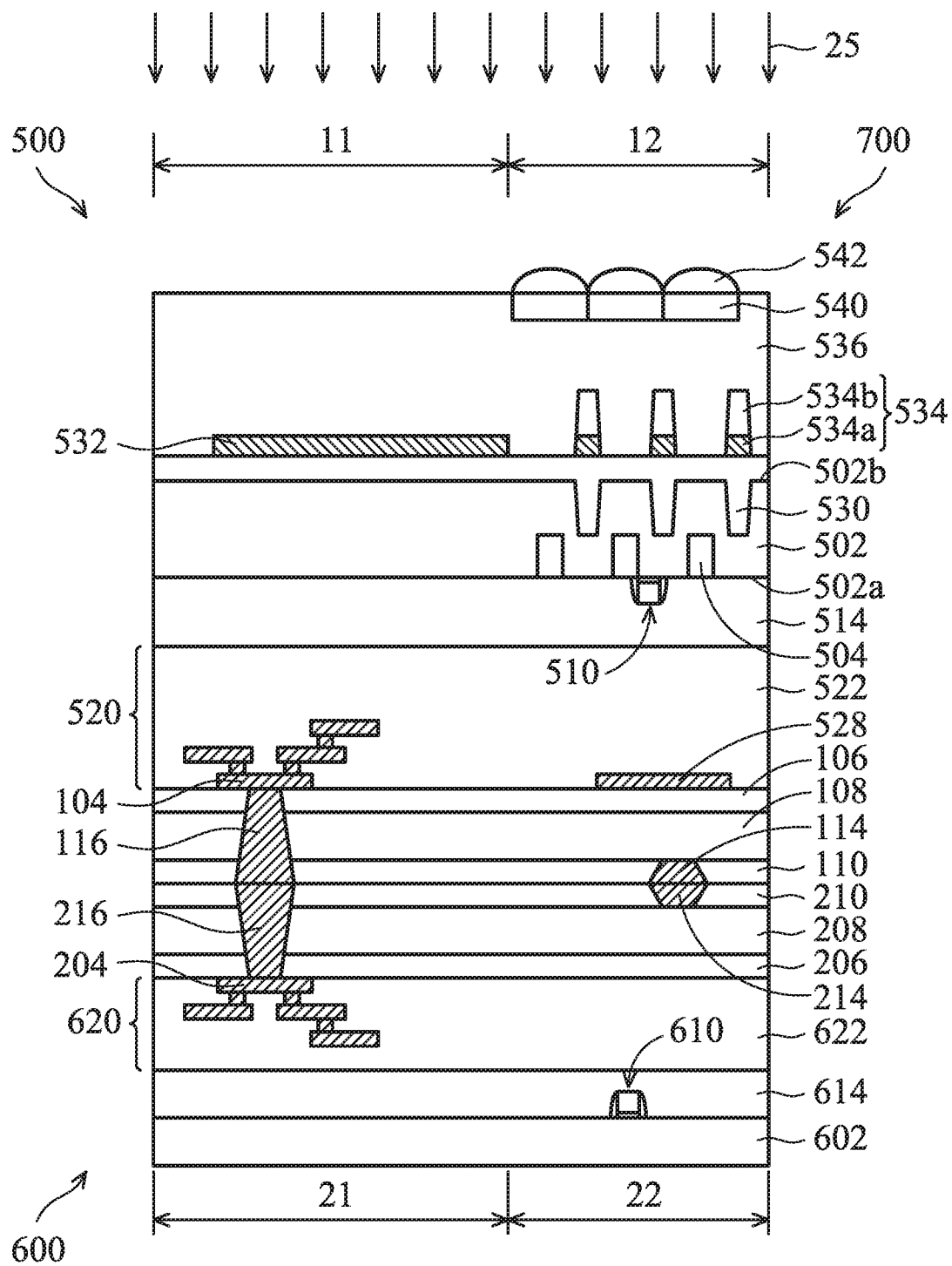

Afterwards, as shown in FIG. 5D, after the hybrid bonding process, a deep isolation structure 530 is formed in the first substrate 502. The deep isolation structure 530 is formed by filling with an isolation material in a deep trench which is formed from the second surface 102b of the first substrate 502.

A number of grid structures 534 are formed over the deep isolation structure 530 in the second region 12. The grid structures 534 are used to guide light towards corresponding the light-sensing region 504. Each of the grid structures 534 includes a bottom portion 534a and a top portion 534b over the bottom portion 534a. In some embodiments, the bottom portion 534a is made of metal material and the top portion 534b is made of dielectric material. A metal shielding structure 532 is formed in on the second surface 502b of the first substrate 502 in the first region 11. A dielectric layer 536 is formed on the grid structures 534 and on the metal shielding structure 532. The dielectric layer 536 is made of silicon nitride, silicon oxynitride, silicon oxide or combinations thereof. The dielectric layer 536 may have a single layer or multiple layers.

A number of color filters 540 are formed in the dielectric layer 536. Each of the grid structures 534 is formed below an interface region between two adjacent color filters 540. The color filters 540 aligned with the light-sensing region 504 are configured to filter visible light and allow light in the red (R), green (G) or blue (B) wavelength to pass through to the light-sensing region 504.

The color filters 540 are made of dye-based (or pigment-based) polymer for filtering out a specific frequency band (for example, a desired wavelength of light). In some other embodiments, the color filters 540 are made of resins or other organic-based materials having color pigments.

A number of microlens structures 542 are formed over the color filters 540. The microlens structures 542 may have a variety of shapes and sizes depending on the index of refraction of the material used for the microlens structures 146. A light 25 is disposed over the second surface 502b of the first substrate 502. The microlens structures 542 direct the light 25 to the respective color filters 540. Then, the light 25 passes through the color filters 540 to the corresponding the light-sensing region 504.

The planar top surface of the first bonding layer 110 is obtained by forming first dummy pad 114 in the second region 12 of the first substrate 102 to reduce the loading effect. Since the etching resistance of the first bonding layer 110 is different from that of the first oxide layer 108, the CMP process stops when the top surface of the first oxide layer 108 is exposed. The thickness of the first bonding layer 110 is smaller than the first oxide layer to reduce the overall package thickness of the semiconductor device structure 300a, 300b, 700. The first bonding via 116 is formed by filling conductive material in the first trench 113. The first trench 113 is formed by performing a single etching process in a reaction chamber. The second width $W_2$ of the first bonding via 116 has a constant width or a tapered width depending on the shape of the first trench 113.

Embodiments for forming a semiconductor structure with a hybrid bonding structure are provided. The semiconductor structure is formed by hybrid bonding a first semiconductor device and a second semiconductor device. The first semiconductor device includes a first substrate, a first etching stop layer, a first oxide layer and a first bonding layer. A first dummy pad is formed in the first bonding layer, and a first bonding via is formed through the first bonding layer, the first oxide layer and the first etching stop layer. The second semiconductor device includes a second dummy pad and a second bonding via similar to the first dummy pad and the first bonding via.

The first bonding via and the second bonding via are respectively formed through multiple layers by performing a single etching process in one reaction chamber. The first bonding via is bonded to the second bonding via, and the first dummy pad is bonded to the second dummy pad. The first dummy pad and the second dummy pad are used to increase the pattern density in the second region to reduce the loading effect. As a result, the planar top surfaces of the first bonding layer and the second bonding layer are obtained. The bonding strength between the first semiconductor device and the second semiconductor device is improved since both of the first bonding layer and the second bonding layer have planar top surfaces. Therefore, the performance of the semiconductor device structure is improved.

In some embodiments, a semiconductor structure is provided. The semiconductor structure includes a first semiconductor device. The first semiconductor device includes a first conductive layer formed over a first substrate; a first etching stop layer formed over the first conductive layer, and the first etching stop layer is in direct contact with the first conductive layer. A first bonding layer is formed over the first etching stop layer, a first bonding via is formed through the first bonding layer and the first etching stop layer, and the first bonding via is electrically connected to the first conductive layer. The semiconductor structure also includes a second semiconductor device. The second semiconductor device includes a second conductive layer formed over a second substrate, a second etching stop layer formed over the second conductive layer, and the second etching stop layer is in direct contact with the second conductive layer. A second bonding layer formed over the second etching stop layer and a second bonding via formed through the second bonding layer and the second etching stop layer. The second bonding via is electrically connected to the second conductive layer. The semiconductor structure further includes a bonding structure between the first substrate and the second substrate, and the bonding structure includes the first bonding via bonded to the second bonding via.

In some embodiments, a semiconductor structure is provided. The semiconductor structure includes an image sensor device. The image sensor device includes a first substrate, the first substrate includes a first interconnect region and a pixel region. A photo-sensing region formed in the first substrate in the pixel region and a first oxide layer formed below the photo-sensing region. A first bonding layer is formed below the first oxide layer and a first bonding via is formed through the first bonding layer and the first oxide layer. The semiconductor structure also includes a logic circuit device formed below the image sensor device. The logic circuit device includes a second substrate, and the second substrate includes a second interconnect region and a logic region. A transistor device formed over the second substrate and a second oxide layer formed over the transistor device. A second bonding layer formed over the second oxide layer and a second bonding via formed through the second bonding layer and the second oxide layer in the second interconnect region. The semiconductor structure includes the hybrid bonding structure between the image sensor device and the logic circuit device, and the hybrid bonding structure includes the first bonding via bonded to the second bonding via.

In some embodiments, a method for forming a semiconductor structure is provided. The method includes forming a first semiconductor device. The step of forming the first semiconductor device includes forming a first oxide layer over a first substrate, and the first substrate includes a pixel region and a first interconnect region. Forming a first bonding layer over the first oxide layer and forming a first recess in the first bonding layer in the pixel region. Forming a first trench through the first bonding layer and the first oxide layer in the first interconnect region and filling a conductive material in the first recess and the first trench to form a first dummy pad and a first bonding via. The method also includes forming a second semiconductor device. The step of forming the second semiconductor device includes forming a second oxide layer over a second substrate, and the first substrate includes a logic region and a second interconnect region. Forming a second bonding layer over the second oxide layer and forming a second recess in the second bonding layer in the logic region. Forming a second trench through the second bonding layer and the second oxide layer and filling the conductive material in the second recess and the second trench to form a second dummy pad and a second bonding via. The method also includes bonding the first semiconductor device and the second semiconductor device by bonding the first bonding via to the second bonding via, and bonding the first dummy pad to the second dummy pad.

In some embodiments, a semiconductor structure is provided. The semiconductor structure includes a first semiconductor device. The first semiconductor device includes a first bonding layer formed below a first substrate, a first bonding via formed through the first oxide layer and the first bonding layer, a first dummy pad formed in the first bonding layer. The semiconductor structure includes a second semiconductor device. The second semiconductor device includes a second bonding layer formed over a second substrate, a second bonding via formed through the second bonding layer, and a second dummy pad formed in the second bonding layer. The semiconductor structure includes a bonding structure between the first substrate and the second substrate, wherein the bonding structure includes the first bonding via bonded to the second bonding via and the first dummy pad bonded to the second dummy pad.

In some embodiments, a semiconductor structure is provided. The semiconductor structure includes an image sensor device and a logic circuit device formed below the image sensor device. The image sensor device includes a plurality of color filter layers formed above a first substrate, a first oxide layer formed below the color filter layers, a first bonding via formed through the first oxide layer. The logic circuit device includes a second oxide layer formed over a second substrate, and a second bonding via formed through the second oxide layer. The semiconductor structure includes a hybrid bonding structure between the image sensor device and the logic circuit device, and the hybrid bonding structure includes the first bonding via bonded to the second bonding via.

In some embodiments, a semiconductor structure is provided. The semiconductor structure includes an image sensor device, and the image sensor device includes a first bonding layer formed below a first substrate, and a first dummy pad formed in the first bonding layer. The semiconductor structure includes a logic circuit device formed below the image sensor device. The logic circuit device includes a second bonding layer formed over a second substrate, and a second dummy pad formed in the second bonding layer. The semiconductor structure includes a hybrid bonding structure between the image sensor device and the logic circuit device, and the hybrid bonding structure includes the first dummy pad bonded to the second dummy pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a first semiconductor device, wherein the first semiconductor device comprises:
 a first bonding layer formed below a first substrate;
 a first bonding via formed through the first bonding layer;
 a first dummy pad formed in the first bonding layer;
 a second semiconductor device, wherein the second semiconductor device comprises:
 a second bonding layer formed over a second substrate;
 a second bonding via formed through the second bonding layer;

a second dummy pad formed in the second bonding layer; and a bonding structure between the first substrate and the second substrate, wherein the bonding structure comprises the first bonding via bonded to the second bonding via and the first dummy pad bonded to the second dummy pad.

2. The semiconductor structure as claimed in claim 1, further comprising:
a first conductive layer formed below the first substrate, wherein the first bonding via is in direct contact with the first conductive layer.

3. The semiconductor structure as claimed in claim 2, further comprising:
a metal block structure formed below the first substrate, wherein the metal block structure and the first conductive layer are at the same level.

4. The semiconductor structure as claimed in claim 1, further comprising:
a photo-sensing region formed in the first substrate, wherein the first dummy pad is below the photo-sensing region.

5. The semiconductor structure as claimed in claim 1, wherein the first bonding layer and the second bonding layer are not made of oxide.

6. The semiconductor structure as claimed in claim 1, wherein the first bonding via has a top surface and a bottom surface, the top surface is closer to the first substrate than the bottom surface, and the first bonding via has a width that is tapered from the bottom surface to the top surface.

7. The semiconductor structure as claimed in claim 1, wherein the first dummy pad is surrounded by the first bonding via when seen from a top-view.

8. The semiconductor structure as claimed in claim 1, wherein a first sidewall surface of the first dummy pad is not aligned with a second sidewall surface of the second dummy pad, and there is a space between the first sidewall surface and the second sidewall surface.

9. The semiconductor structure as claimed in claim 1, further comprising:
a transistor device formed below the first substrate, wherein the first substrate has a first surface and a second surface opposite to the first surface, and the transistor device is formed below the first surface;
a plurality of grid structures formed over the second surface of the first substrate;
a plurality of color filter layers formed over the grid structures; and
a plurality of microlens structures formed over the color filter layers.

10. A semiconductor structure, comprising:
an image sensor device, wherein the image sensor device comprises:
a plurality of color filter layers formed above a first substrate;
a first oxide layer formed below the color filter layers;
a first bonding via formed through the first oxide layer;
a first etching stop layer between the color filter layers and the first oxide layer, and the first bonding via is through the first etching stop layer; and
a logic circuit device formed below the image sensor device, wherein the logic circuit device comprises:
a second oxide layer formed over a second substrate;
a second bonding via formed through the second oxide layer; and
a hybrid bonding structure between the image sensor device and the logic circuit device, and the hybrid bonding structure comprises the first bonding via bonded to the second bonding via.

11. The semiconductor structure as claimed in claim 10, further comprising:
a first interconnect structure formed below the first substrate, wherein the first bonding via is electrically connected to a conductive layer of the first interconnect structure.

12. The semiconductor structure as claimed in claim 10, further comprising:
a first dummy pad formed below the first oxide layer; and
a second dummy pad formed over the second oxide layer, wherein the first dummy pad is bonded to the second dummy pad.

13. The semiconductor structure as claimed in claim 12, wherein a first sidewall surface of the first dummy pad is not aligned with a second sidewall surface of the second dummy pad, and there is a space between the first sidewall surface and the second sidewall surface.

14. The semiconductor structure as claimed in claim 10, wherein the first bonding via has a top surface and a bottom surface, the top surface is closer to the first substrate than the bottom surface, and the first bonding via has a width that is tapered from the bottom surface to the top surface.

15. A semiconductor structure, comprising:
an image sensor device, wherein the image sensor device comprises:
a first bonding layer formed below a first substrate;
a first dummy pad formed in the first bonding layer; and
a logic circuit device formed below the image sensor device, wherein the logic circuit device comprises:
a second bonding layer formed over a second substrate;
a second dummy pad formed in the second bonding layer; and
a hybrid bonding structure between the image sensor device and the logic circuit device, and the hybrid bonding structure comprises the first dummy pad bonded to the second dummy pad.

16. The semiconductor structure as claimed in claim 15, further comprising
a first bonding via formed in the first bonding layer;
a second bonding via formed in the second bonding layer, wherein the hybrid bonding structure further comprises the first bonding via bonded to the second bonding via.

17. The semiconductor structure as claimed in claim 15, further comprising:
a photo-sensing region formed in the first substrate, wherein the first dummy pad is below the photo-sensing region.

18. The semiconductor structure as claimed in claim 15, further comprising:
a second transistor device formed over the second substrate; and
a second interconnect structure formed over the second substrate, wherein the second bonding via is in direct contact with a conductive layer in the second interconnect structure.

19. The semiconductor structure as claimed in claim 15, further comprising:
a first transistor device formed between the first substrate and the first dummy pad.

20. The semiconductor structure as claimed in claim 10, wherein the logic circuit device further comprises a second etching stop layer below the second oxide layer, and the second bonding via is through the second etching stop layer.

* * * * *